United States Patent
Stam et al.

(10) Patent No.: US 7,683,326 B2
(45) Date of Patent: Mar. 23, 2010

(54) VEHICLE VISION SYSTEM WITH HIGH DYNAMIC RANGE

(75) Inventors: Joseph S. Stam, Holland, MI (US); Keith H. Berends, Hudsonville, MI (US); Gregory S. Bush, Grand Rapids, MI (US); Jeremy B. Banks, Grand Rapids, MI (US); Eric J. Walstra, Grand Rapids, MI (US)

(73) Assignee: Gentex Corporation, Zeeland, MI (US)

( * ) Notice: Subject to any disclaimer, the term of this patent is extended or adjusted under 35 U.S.C. 154(b) by 1487 days.

(21) Appl. No.: 10/615,317

(22) Filed: Jul. 8, 2003

(65) Prior Publication Data

US 2004/0008410 A1 Jan. 15, 2004

Related U.S. Application Data

(60) Provisional application No. 60/394,583, filed on Jul. 9, 2002.

(51) Int. Cl.
*G01J 5/02* (2006.01)

(52) U.S. Cl. ............... 250/339.11; 250/332; 250/341.1; 180/169

(58) Field of Classification Search ................. 250/332, 250/341.1, 339.11; 180/169
See application file for complete search history.

(56) References Cited

U.S. PATENT DOCUMENTS

| | | | |
|---|---|---|---|
| 2,632,040 A | 3/1953 | Rabinow | |
| 2,827,594 A | 3/1958 | Rabinow | |
| 4,139,801 A | 2/1979 | Linares | |
| 4,236,099 A | 11/1980 | Rosenblum | |
| 4,357,558 A | 11/1982 | Massoni et al. | |
| 4,376,909 A | 3/1983 | Tagami et al. | |
| 4,599,544 A | 7/1986 | Martin | |
| 4,665,321 A | 5/1987 | Chang et al. | |
| 4,692,798 A | 9/1987 | Seko et al. | |
| 4,727,290 A | 2/1988 | Smith et al. | |
| 4,768,135 A | 8/1988 | Kretschmer et al. | |
| 4,862,037 A | 8/1989 | Farber et al. | |
| 4,891,559 A | 1/1990 | Matsumoto et al. | |
| 4,930,742 A | 6/1990 | Schofield et al. | |
| 4,967,319 A | 10/1990 | Seko | |
| 5,036,437 A | 7/1991 | Macks | |
| 5,072,154 A | 12/1991 | Chen | |
| 5,086,253 A | 2/1992 | Lawler | |
| 5,124,549 A | 6/1992 | Michaels et al. | |
| 5,182,502 A | 1/1993 | Slotkowski et al. | |
| 5,187,383 A | 2/1993 | Taccetta et al. | |
| 5,235,178 A | 8/1993 | Hegyi | |
| 5,329,206 A | 7/1994 | Slotkowski et al. | |

(Continued)

FOREIGN PATENT DOCUMENTS

DE 2946561 A1 5/1981

(Continued)

*Primary Examiner*—David P Porta
*Assistant Examiner*—Jessica L Eley
(74) *Attorney, Agent, or Firm*—James E. Shultz, Jr.

(57) ABSTRACT

A vehicular vision system is disclosed comprising a high dynamic range. The systems and methods are advantages for rear vision, collision avoidance, obstacle detection, adaptive cruise control, rain sensing, exterior light control, and lane departure warning, as well as other applications where a given scene may comprise objects having widely varying brightness values.

15 Claims, 7 Drawing Sheets

U.S. PATENT DOCUMENTS

| | | | |
|---|---|---|---|
| 5,416,318 A | 5/1995 | Hegyi | |
| 5,426,294 A | 6/1995 | Kobayashi et al. | |
| 5,434,407 A | 7/1995 | Bauer et al. | |
| 5,451,822 A | 9/1995 | Bechtel et al. | |
| 5,471,515 A | 11/1995 | Fossum et al. | |
| 5,508,592 A | 4/1996 | Lapatovich et al. | |
| 5,537,003 A | 7/1996 | Bechtel et al. | |
| 5,550,677 A | 8/1996 | Schofield et al. | |
| 5,614,788 A | 3/1997 | Mullins et al. | |
| 5,660,454 A | 8/1997 | Mori et al. | |
| 5,666,028 A | 9/1997 | Bechtel et al. | |
| 5,715,093 A | 2/1998 | Schierbeek et al. | |
| 5,796,094 A | 8/1998 | Schofield et al. | |
| 5,811,888 A | 9/1998 | Hsieh | |
| 5,812,321 A | 9/1998 | Schierbeek et al. | |
| 5,837,994 A | 11/1998 | Stam et al. | |
| 5,841,126 A | 11/1998 | Fossum et al. | |
| 5,912,534 A | 6/1999 | Benedict | |
| 5,923,027 A | 7/1999 | Stam et al. | |
| 5,942,853 A | 8/1999 | Piscart | |
| 5,990,469 A | 11/1999 | Bechtel et al. | |
| 6,008,486 A | 12/1999 | Stam et al. | |
| 6,049,171 A | 4/2000 | Stam et al. | |
| 6,097,023 A | 8/2000 | Schofield et al. | |
| 6,130,421 A | 10/2000 | Bechtel et al. | |
| 6,144,158 A | 11/2000 | Beam | |
| 6,396,397 B1 | 5/2002 | Bos et al. | |
| 6,406,172 B1 | 6/2002 | Harbers et al. | |
| 6,442,465 B2 | 8/2002 | Breed et al. | |
| 6,552,342 B2 * | 4/2003 | Holz et al. | 250/330 |
| 6,603,507 B1 * | 8/2003 | Jiang et al. | 348/216.1 |
| 6,730,913 B2 * | 5/2004 | Remillard et al. | 250/341.8 |
| 2002/0040962 A1 | 4/2002 | Schofield et al. | |
| 2002/0070342 A1 * | 6/2002 | Berenz et al. | 250/353 |
| 2002/0117340 A1 * | 8/2002 | Stettner | 180/169 |
| 2002/0118282 A1 * | 8/2002 | Nakamura | 348/148 |
| 2003/0043280 A1 * | 3/2003 | Nagao et al. | 348/216.1 |

FOREIGN PATENT DOCUMENTS

| | | |
|---|---|---|
| EP | 1330132 A2 | 7/2003 |
| FR | 2641237 A1 | 7/1990 |
| FR | 2726144 A1 | 4/1996 |
| JP | 7-47878 | 2/1995 |
| JP | 7-69125 | 3/1995 |
| JP | 8-166221 | 6/1996 |
| WO | WO 8605147 | 9/1986 |
| WO | WO 9735743 | 10/1997 |
| WO | WO 9843850 | 10/1998 |
| WO | WO 9947396 | 9/1999 |
| WO | WO 0022881 | 4/2000 |
| WO | WO 03045734 A1 | 6/2003 |

* cited by examiner

VEHICLE VISION SYSTEM WITH HIGH DYNAMIC RANGE

CROSS-REFERENCE TO RELATED APPLICATION

This application claims priority under 35 U.S.C. §119(e) to the following: U.S. Patent Provisional Application No. 60/394,583, entitled "VEHICLE VISION SYSTEM WITH HIGH DYNAMIC RANGE," filed on Jul. 9, 2002, Joseph S. Stam et al. The disclosure of the above-referenced provisional application is incorporated herein in its entirety.

BACKGROUND OF THE INVENTION

Several vehicle vision applications that utilize an image sensor to either control a vehicle function or provide an image to a driver have been proposed. Example applications include exterior light control, rain sensing, obstacle detection, collision avoidance, adaptive cruise control, lane departure warning, and night vision systems. Many image sensor technologies can provide for a wide interscene dynamic range by adjusting exposure between frames. High intrascene dynamic range, the range of brightness of objects which can be detected within a single frame, is more technically challenging to achieve. Examples of CMOS image sensors having high interscene and intrascene dynamic range are given in U.S. Pat. Nos. 6,175,383; 6,115,065; 6,008,486 and published U.S. patent application 20020057845. Additionally, high dynamic range image sensors are available from Pixim, Inc. of Mountain View, Calif. and Fill Factory, Inc. of Belgium. Charge coupled device (CCD) based high dynamic range image sensors are also available from numerous suppliers.

Most image sensing technologies providing high dynamic range involve construction of a relatively more complex pixel than traditional image sensors of lower dynamic range. As a result, such sensors are typically more expensive.

Vehicular night vision systems are currently being manufactured and proposed to improve night time driving safety by providing a supplemental view of the forward scene as imaged by a near infrared (NIR) or far infrared (FIR) image sensor assembly. Such systems have the advantage of being more sensitive than human vision and sensitive to radiation not visible to the human eye. An overview of currently available night vision technologies is contained in University of Michigan Transportation Research Institute publication UMTRI 2002-12, by Kåre Ruman, entitled Night Vision Enhancement Systems: What should they do and what more do we need to know, the content of this publication is incorporated in its entirety herein by reference.

The most significant problem with known vehicular vision systems is the washout and blooming that occurs from oncoming vehicle headlamps or other lamps within the scene. For conventional image sensors, this results from the fact that the image sensor pixels do not possess the dynamic range to sense both bright headlamps and the faint objects in the scene. If the sensitivity of the imager is set sufficiently high for adequate imaging of the scene when illuminated by a NIR light source, oncoming headlamps will substantially saturate the area of the imaged oncoming vehicle and severely limit the ability to see faint objects close in proximity to the oncoming vehicle. If the imager's sensitivity is set such that oncoming headlamps do not saturate the image, faint objects in the scene are not visible, thus negating most benefits of the night vision system. Since a goal of night vision systems is to provide nighttime forward vision substantially superior to the human visual system, even in the presence of oncoming traffic, this problem must be solved.

The high dynamic range image sensors described in the previously incorporated references solve the primary problem of limited pixel dynamic range. Another problem, electronic blooming, is also substantially solved with the use of known high dynamic range CMOS image sensors. Electronic blooming occurs in some image sensors when electrons generated in one pixel spill over into neighboring pixels, resulting in bright objects being imaged as a much larger object than they actually are and thus inhibiting the ability to resolve other objects in close proximity to the bright object. The pixel structure of these imagers inherently greatly reduces electronic blooming thus alleviating this problem. Anti-bloom drains are also added to pixels to further inhibit blooming. While the term blooming is commonly used to describe this phenomena, the more specific term electronic blooming will be used herein to distinguish from optical blooming or other types of scattering which have a similar effect on the resultant image. The more generic term blooming will be used herein to refer to the effect of a bright object being imaged larger than the actual object, regardless of whether the cause of the blooming is electronic, optical, or otherwise.

Due to the large variance in scene illumination and intensity of imaged light sources in vehicular applications, vision systems having a high dynamic range are desirable. What is needed is a vehicular vision system, comprising a high dynamic range, capable of detecting objects within a scene that have substantially varying brightness levels.

SUMMARY OF THE INVENTION

In at least one embodiment, a high dynamic range image sensor is used. In a related embodiment, a synthetic high dynamic range image is produced by adding together a series of individually acquired images having various exposure periods.

In at least one embodiment, an image sensor is provided that comprises a silicon substrate and a passivation layer material over at least a portion of the image sensor.

In at least one embodiment, a first antireflective coating is provided between at least a portion of the silicon substrate associated with an image sensor and a passivation layer material that covers at least a portion of the image sensor.

In at least one embodiment, an antireflective coating is provided on at least a portion of a side of a passivation layer material provided opposite from the silicon substrate associated with an image sensor.

In at least one embodiment an image sensor is provided that is at least partially sealed within an encapsulated package and an antireflective coating is provided on at least a portion of the encapsulated package.

In at least one embodiment, non-silicon features within a pixel region of an image sensor are coated with a light ray absorptive material.

In at least one embodiment a light source is configured to emit light rays in the non-visible spectrum to illuminate objects within a scene external to a controlled vehicle beyond an exterior surface of a windshield. In a related embodiment, the light source is configured to operate in synchronous relationship with acquisition of images from an image sensor.

In at least one embodiment, a spectral filter located between an image sensor and a scene to be imaged is provided. In a related embodiment, the spectral filter is configured to substantially block light rays other than the predominant spectral band of light rays emitted by an associated light source.

In at least one embodiment, a control system configured to activate a light source and, or, to acquire images from an image sensor is provided. In at least one embodiment, the control system is configured to acquire at least one first image while a light source is at least partially energized and is configured to acquire at least one second image while the light source is de-energized and is configured to generate a synthetic image by subtracting the second image from the first image on a pixel by pixel basis. In at least one related embodiment, a light source is configured to be at least partially energized and at least partially de-energized in succession to produce a coded pattern and the control system is configured to acquire a series of images and identify the coded pattern.

In at least one embodiment, a vehicular vision system is provided that is capable of producing a synthetic high dynamic range image. In related embodiments, the synthetic high dynamic range image is produced by adding individually acquired images having either unique exposure times or by acquiring images from individual groups of pixels having unique attenuation filters.

In at least one embodiment, a vehicular vision system is provided that is capable of identifying individual light sources and, or, objects within a scene. In a related embodiment, the vehicular vision system is capable of identifying individual light sources and, or, objects within a synthetic high dynamic range image.

DETAIL DESCRIPTION OF THE PREFERRED EMBODIMENTS

Figure 1:
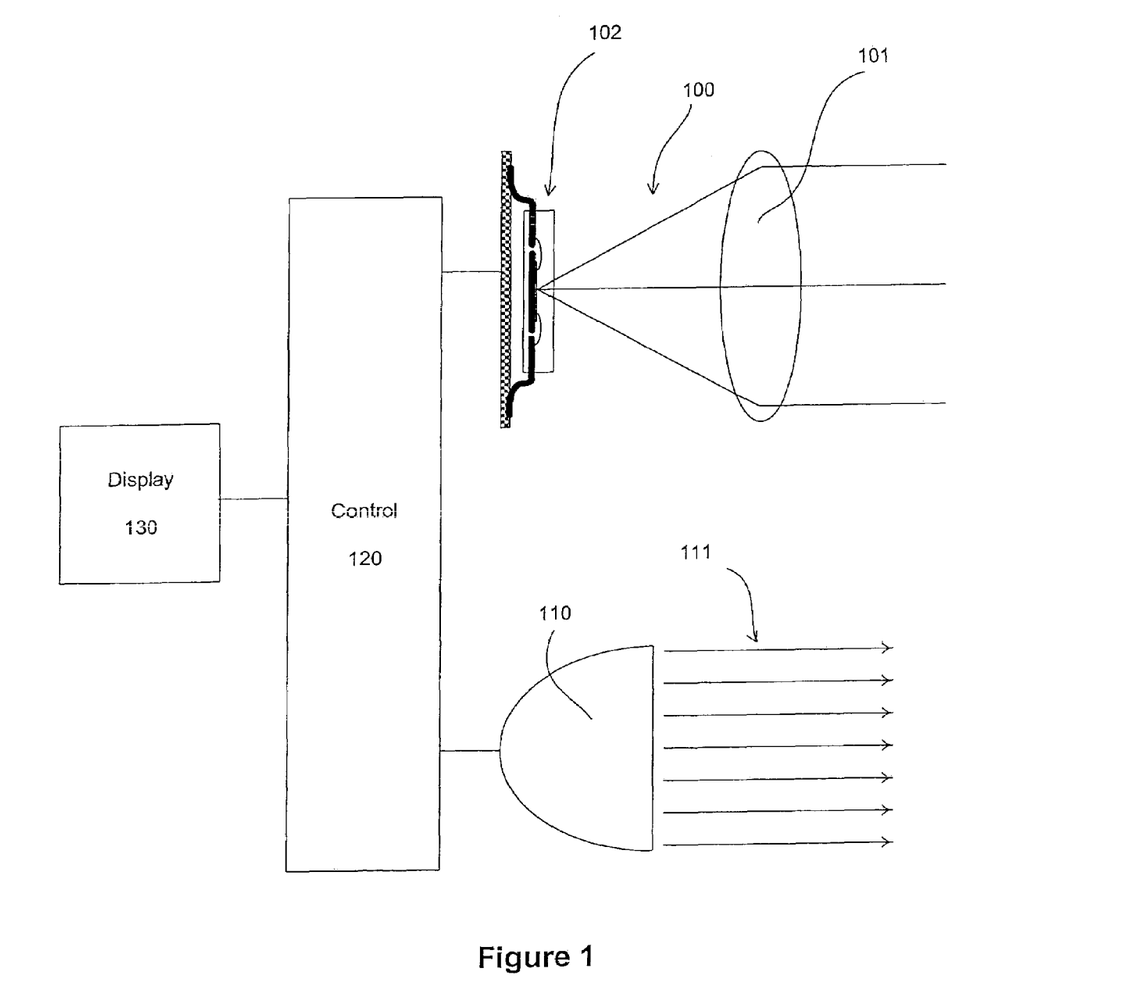
FIG. 1 depicts a block diagram of an embodiment of a vehicular vision system.

A vehicular vision system with high dynamic range for use as a night vision system and, or, for other vehicular applications may be constructed utilizing a high dynamic range image sensor as depicted in FIG. 1. An imaging assembly 100 comprises an image sensor assembly 102 and a lens system 101. The lens system 101 forms an image of the forward scene of the controlled vehicle that is sensed electronically by the image sensor assembly 102. A NIR light source 110 projects NIR illumination, shown as NIR light rays 111, onto the scene to be imaged. The use of NIR illumination for the forward scene is advantageous because it can be sensed by electronic imaging technology but is not visible to humans and thus will not cause glare to other drivers. Therefore, the scene can be illuminated such that faint objects even at long distances may be detectable by image sensor assembly 100.

NIR light source 110 may be of various types such as an incandescent light source or high-intensity discharge source with a visible light blocking filter, NIR LEDs, NIR Lasers or any other NIR light source. Typical NIR light sources project light of wavelengths within the range from just beyond the visible light cutoff (about 780 nm) to the maximum wavelength detectable by the image sensor assembly (about 1200 nm). The NIR light source may be narrow band or broad band. Specific types of NIR light sources have particular advantages which will be described in more detail herein.

The dynamic range of a standard image sensor may be extended through the use of a patterned filter array covering the individual pixels of an image sensor in a checkerboard, striped, or mosaic fashion. Some pixels may be uncovered, some covered with a partially attenuating spectral filter and others covered with a highly attenuating spectral filter. The uncovered pixels are the most sensitive and thus capable of sensing faint objects but will saturate when imaging high intensity objects. The partially attenuating spectral filtered pixels will appropriately image objects of medium intensity and the highly attenuating filtered pixels will appropriately image objects of high intensity. A synthetic image may be constructed by selecting an appropriate filtered pixel from a group of pixels for each location in the image. Preferably, the least filtered pixel from a given group of pixels that is not saturated is chosen. The total resolution of the image is reduced by a factor equal to the number of filtering levels, however it is possibly more economical to choose a standard imager of higher resolution than necessary than to utilize a more complex high dynamic range pixel structure of lower resolution.

Interpolation techniques may also be employed to restore some resolution. The above technique is somewhat similar to techniques for color imaging through the use of a mosaic patterned color filter.

The two techniques may be combined by using multiple filtered of both varying attenuation and varying color filtration to achieve a synthetic high dynamic range color image.

A control system 120 is responsible for controlling light source 110 and image sensor assembly 100 and providing an image of the forward scene of the controlled vehicle on display 130. Control 120 may perform various functions such as simply activating the image sensor assembly and light source at the appropriate times or performing sophisticated image processing and controlling potentially complex interactions of the light source, image sensor assembly, and display. Control 120 is shown in FIG. 1 simply as a block component in the diagram. One skilled in the art will realize that control 120 may take various forms and may comprise few or multiple components located throughout the vehicle. Display 130 may be any type of display useful for presenting the view of the forward scene to the driver and the present invention is not limited to any specific display method. Suitable displays are described in commonly assigned U.S. provisional patent application Ser. No. 60/446,872, the disclosure of which is incorporated in its entirety herein by reference. Generally available liquid crystal displays, cathode ray tubes, plasma displays, and the like are also within the scope of the present invention. Applicable methods of providing and controlling a display are provided in commonly assigned, co-pending, U.S. patent application Ser. No. 09/001,855 entitled Vehicle Vision System and hereby incorporated in its entirety by reference.

The image sensor assembly, NIR light source, control and display may be located in various places within the vehicle. The image sensor assembly may be advantageously located in a vehicle's rear-view mirror which provides an unobstructed view of the forward scene while being protected within the vehicle cabin. One suitable mounting assembly is described in U.S. provisional patent application Ser. No. 60/448,793, the entire disclosure of which is incorporated herein by reference. Control may be, at least in part, co-located with the image sensor assembly or may be located elsewhere within the associated vehicle. The NIR light source may be constructed as part of a vehicle exterior light assembly or provided as a separate assembly. Multiple NIR light sources may be used. The display may be mounted as part of the instrument panel, as a heads-up display, in the overhead counsel, in the rear-view mirror or any other suitable location.

Figure 2:
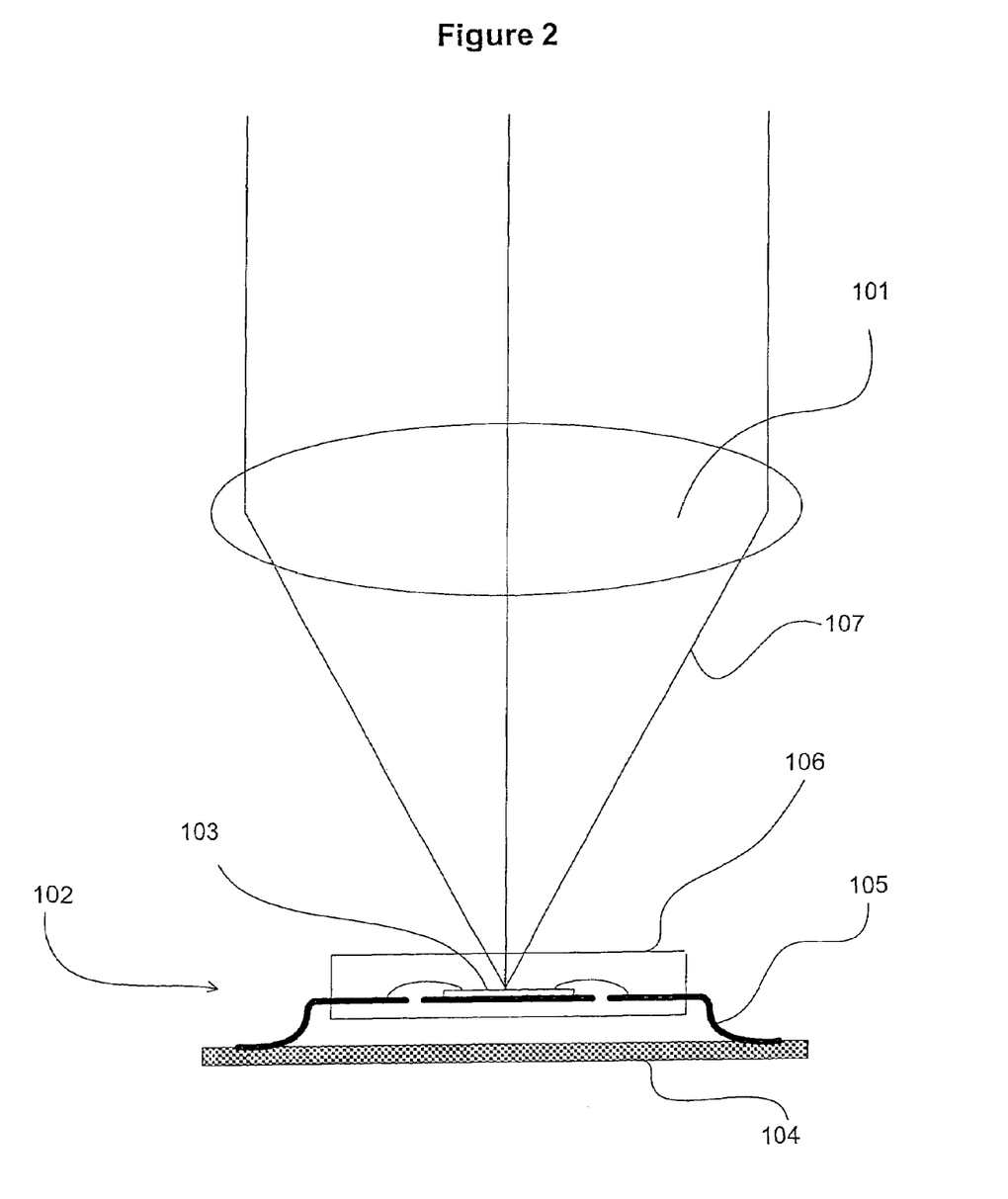
FIG. 2 depicts a cross sectional view of an image sensor.

Greater detail of image sensor assembly 102 is provided with reference to FIG. 2. The lens 101 projects light rays 107 onto image sensor chip 103. Image sensor chip 103 is preferably a high-dynamic range image sensor such as those described in more detail within the incorporated references. However, various image sensing technologies including various types of CMOS image sensors and CCD image sensor may be used with various degrees of performance.

Image sensor chip 103 is preferably contained, at least in part, in a package formed from a lead frame 105 and an encapsulant 106. Wire bonds form electrical connection between the image sensor chip 103 and the leadframe 105. The package is soldered onto a printed circuit board 104 forming electrical connection to the remaining system circuitry. As an alternative to the encapsulated package, image sensor chip 103 may be packaged in a cavity style package with a glass lid protecting the chip. Additionally, a virtually endless combination of packaging and assembly techniques have been proposed for forming image sensor assembly assemblies, many of which may be suitable for use with the present invention.

While NIR night vision systems constructed using a high dynamic range image sensor exhibit substantially improved performance over those constructed with conventional image sensors, some blooming and ghosting does occur and faint objects in close proximity to oncoming vehicles are often not clearly detectable. Additionally, sensitivity improvements are desirable to reduce the intensity of the NIR light source 110 which is needed to provide sufficient detection.

Figure 3:
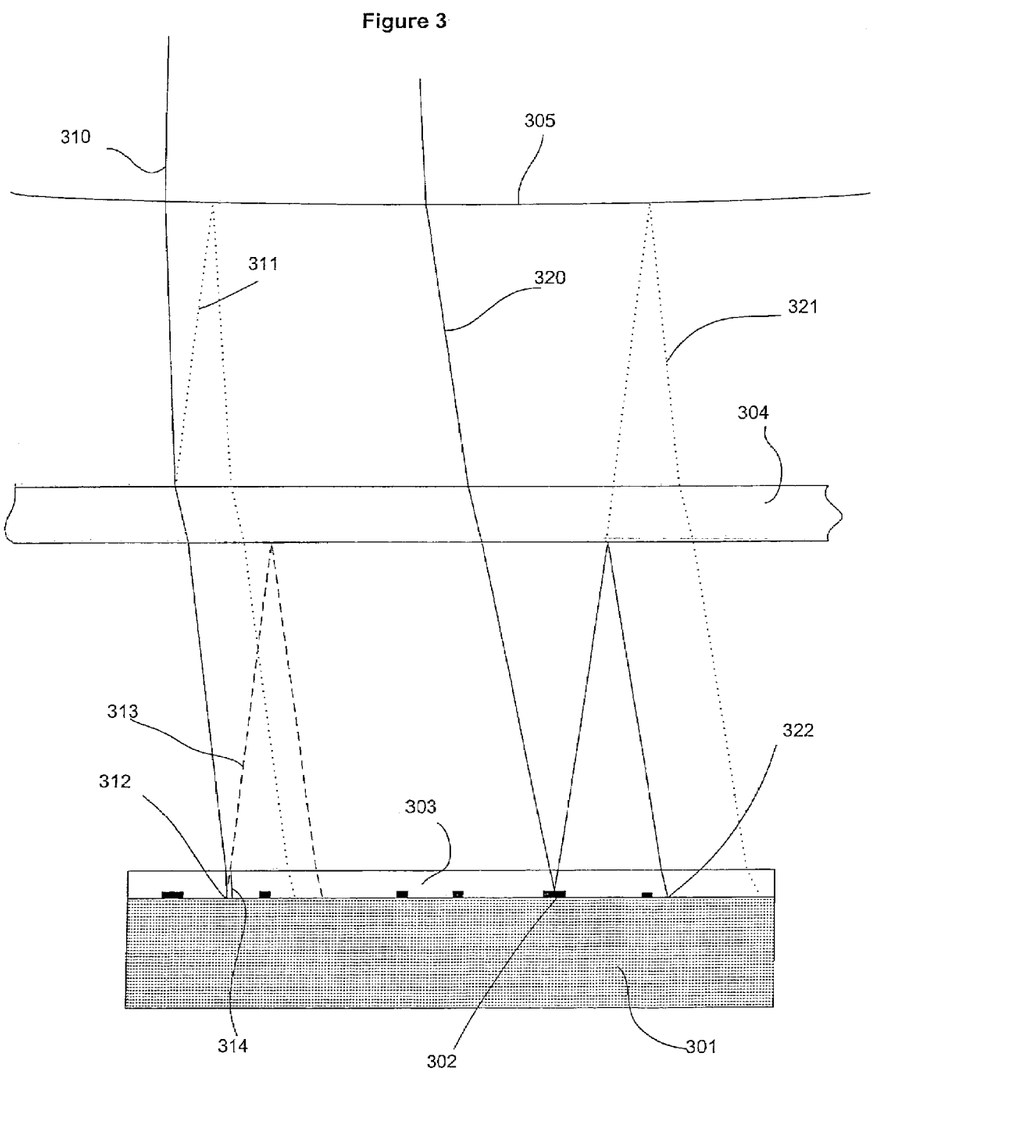
FIG. 3 depicts a cross sectional view of an image sensor showing various light ray reflections.

The primary causes of the remaining problems are optical, and are described with reference to FIG. 3. A segment of an image sensor chip is shown. The chip has a silicon substrate 301 which contains the pixels that absorb incident photons and store the resultant generated electrons. The surface of the silicon may contain metal electrodes 302 which serve to conduct electricity through the chip. Additionally, the chip may contain a passivation layer 303 usually made of silicon nitride or silicon dioxide which protects the chip. A piece of the package cover 304 is shown suspended above the chip. Finally, the lens surface nearest the imager is shown as 305. A variety of light ray paths are shown. The figure is not to scale and light ray paths are not shown to scale but are intended to illustrate a problem. An infinite combination of light ray paths are possible and those shown do not comprehensively describe the various scattering phenomena. Rather, they are intended as examples of non-ideal optical behavior that the present invention is intended to address.

A first light ray 310 propagates through the lens system and is refracted at surface 305. Light ray 310 hits package lid 304 and a portion of the light ray is reflected back as light ray 311. The percent of optical energy reflected is dependent on the index of refraction ratio between the incident media (air) and the lid. Typically, for a glass lid about 4% of energy is reflected. Since lid 304 has two surfaces approximately 8% of the energy is reflected, however each surface reflection produces a separate light ray. Only the top surface light ray 311 is shown. The remainder of light ray 310 that transmits through lid 304 falls incident on the passivation layer 303 (another portion of light ray 310 (not shown) will again be reflected off of the passivation layer). Finally, light ray 310 is incident on the silicon substrate 301 at point 312. Since silicon has a significantly higher index of refraction than the materials used for passivation, a significant portion of light ray 310 reflects off of silicon substrate 301. Typically, about 17% of the energy incident on the silicon substrate will reflect. This reflected light is shown as light ray 313. Light ray 313 may be again split at the passivation surface and be reflected as light ray 314, which is incident on the silicon substrate only slightly offset from point 312. The remainder of light ray 313 will propagate back up the optical system, a portion of which may reflect off of the package lid 304 and the remainder of which may reflect off of the various other surfaces in the optical system.

Another light ray 320 may propagate in a similar way to light ray 310. Light ray 320, however, may hit a metal electrode 302. Since electrodes 302 are typically formed from a metal such as Aluminum which is highly reflective, light ray 320 may substantially reflect off the electrode. This light ray will thus propagate back up through the optical system and reflect and be incident again at a point 322 which may be a substantial distance from the original point of incidence. This light ray may also split as light ray 321 which is then further subject to various reflections and splits.

The amplitude of a split and reflected light ray is usually quite small compared with the primary light ray. A light ray which reflects off the substrate and then back off of the package lid is only 4% of 17%, or less than 1% of the original light ray amplitude. With conventional imaging systems, these split and reflected light rays can usually be ignored. However, with a high dynamic range imaging system these split light rays from very bright objects still cause significant signal in the image. In general, the unique requirements of a vehicular high dynamic range vision system force serious consideration of issues which are typically ignored for other applications.

The split light rays can have several effects. Scattered light rays can create a blooming effect, causing objects to be imaged larger than they actually are. This can also result in blurring of objects together and decreasing the sharpness of the image. Split light rays can cause multiple images of a bright light to appear in an image. For instance, a pair of oncoming headlamps may appear as a bright image in the actual location of the headlamps and also as a ghost image offset from the primary image. For extremely bright oncoming lights, multiple ghosts can occur. Scattered light rays may also reflect off of mechanical parts of the assembly such as the lens baffle and contribute as a background noise in the image, sometimes causing a foggy appearance to the scene. Finally any energy reflected off of the surface of the image sensor or other surfaces reduces the power of the light ray when absorbed in the pixel, thus reducing the overall sensitivity of the system.

The present invention seeks to solve the unique issues of a high dynamic range vehicular vision system through a variety of techniques. These techniques may be employed individually to achieve improvement in imaging quality or in various combinations to achieve the highest levels of performance.

In at least one embodiment, the most significant source of reflections is substantially reduced through the use of an antireflective coating between the silicon substrate 301 of the image sensor chip and the passivation layer 303. The antireflection coating is preferably deposited on the silicon wafer after wafer fabrication is complete but before passivation. This coating is typically a material with an index of refraction between that of silicon and that of the passivation material. Example materials include titanium dioxide and diamond. Titanium dioxide may be deposited by sputtering or evaporation and diamond may be deposited by chemical vapor deposition techniques. For example, consider a silicon wafer with a 5 μm $SiO_2$ passivation. Adding a 100 nm thick layer of titanium dioxide between the silicon and the passivation material reduces the total reflection of the surface of the chip in the wavelength range of 800 nm to 1000 nm from about 20% to less than 5% and thus additionally increasing sensitivity by 15%.

Surface reflection can further be reduced by placing an antireflection coating on the surface of the passivation opposite the imaging chip. The type of coating used will depend upon the material on top of the chip. In the prior example, the chip was assumed to be packaged in a cavity such that the surface was open to air. In this configuration the air-$SiO_2$ interface results in a 4% surface reflection. If the chip were encapsulated in an epoxy package, as is shown in FIG. 2, there would be little reflection from the top surface of the passivation since the index of refraction of $SiO_2$ and many encapsulants is similar. However, there would be a reflection from the surface of the package, which may also be advantageously coated with an antireflection coating.

Yet a further improvement can be made by covering metal or other non-silicon features within the pixel regions with an absorptive coating. Black pigmented photoresist light absorbing materials suitable for this purpose are available from Brewer Science Inc., of Rolla Mo. By absorbing light that would have been reflected by the metal features, spurious reflections and scatters can be eliminated. This feature is of particular advantage for pixel structures having low fill factor where a significant portion of the pixel may contain metal features used in the supporting circuitry for the pixel. This is of particular relevance for high dynamic range image sensors that typically utilize more complex pixel structures with lower fill factors than conventional pixels.

In another embodiment of the present invention, optimal selection of the NIR light source 110 provides significant improvement in image quality. Several types of NIR light sources may be used. The most widely available NIR source is a halogen light bulb in combination with a visible light blocking filter. This bulb may function similarly to a high-beam headlamp, however with the visible light blocked there is no concern of glare for oncoming drivers and thus the lamp can be on whenever the vision system is activated.

A disadvantage of using an incandescent light source is the associated broadband emission of the source. Light is emitted over a wide range of wavelengths, this has several disadvantages. First, light emitted in the visible band must be filtered out, resulting in a low efficiency system since much of the emitted energy is not used. Second, the use of a broadband source makes it more difficult to produce high-performance anti-reflective coatings for the associated optical components. Typically, high-quality image sensor assembly lenses are coated with anti-reflective coatings. By coating all optical surfaces with an anti-reflective coating the effects of scattering and of multiple reflections are reduced to a level of 1-2% over a broad spectrum rather than the 4% reflectance of uncoated glass. While this reduction in reflection is advantageous and would provide benefit to a night vision system, higher reductions in reflection are possible when only a narrow bandwidth of light is considered. For narrow wavelength range coatings, providing less than 0.1% reflection is achievable at reasonable costs. Coatings providing such reduction in reflectance over wide bandwidths are either complex and expensive or simply not producible.

Although broadband light sources may be used, a preferred light source for use with the present invention is a high-powered infrared LED source. Methods for constructing high power LED illuminators are described in commonly assigned U.S. Pat. No. 6,335,548 and U.S. patent application Ser. Nos. 09/800,460 and 09/835,238, each of which is incorporated in its entirety herein by reference. Sources suitable for use as a night vision illumination source can be constructed according to these references with the use of a NIR LED chip emitting light anywhere from about 780 nm to 1100 nm and most preferably about 850 nm. The use of an LED source has several advantages. First, LEDs are narrow band emitters. Therefore, all optical surfaces may be coated with very low reflection coating at a reasonable cost. Second, the silicon surface may also be coated with an anti-reflection coating as described above and optimized for the corresponding narrow bandwidth.

Further improvement can be made with the addition of a narrow bandpass optical filter placed within the image sensor assembly anywhere between the scene and the image plane. The bandpass filter is preferably constructed to transmit only the wavelengths of light emitted by the LED and either absorb or reflect all other wavelengths. The bandpass filter is preferably constructed as a multi-layer thin film filter. Alternatively the bandpass filter may be coated on any of the optical surfaces of the image sensor assembly, including the image sensor face. The bandpass filter greatly cuts down the amount of light from an oncoming headlamp arriving at the image sensor since the oncoming headlamp is primarily a visible light emitter and the LED is an infrared emitter. Thus, the ratio between reflected light from illuminator 110 and light from oncoming headlamps is greatly increased.

Yet a further improvement is realized by pulsing the LED source synchronously with acquisition of the image sensor assembly. It is well established that the instantaneous current with which an LED is driven can be increased if the duty cycle is decreased. For example, if an LED is only driven at a 20% duty cycle, the current driving the LED, and thus the instantaneous intensity of the LED, can be increased approximately five times higher than if the LED is operated at 100% duty cycle. It is advantageous to use this relationship to increase the proportion of reflected light imaged to light emitted from other sources. Image acquisition is synchronized to acquire images only when the NIR source is activated. This may be accomplished by using an exposure time which is the duration of the NIR source activation time or by using a shutter. If the LED duty cycle is, for example, only 20% but the LED instantaneous intensity is about five times higher than it would be at 100% duty cycle, the image sensors exposure to the reflected light is the same as if the imager and LEDs operate continuously. However, the exposure to light emitted from other sources is reduced by a factor of five.

As a further example, consider an imaging system with a 30 frame per second desired frame rate. Typically, a light source would be active continuously and the image sensor would continuously acquire a new frame every 33 ms, integrating the full time between. Using the 20% duty cycle example, the LEDs would be activated for 6.7 ms at the start of each frame time and the image sensor would integrate for this 6.7 ms. For the remaining 26.6 ms, the LEDs would be shut off and the image sensor would not integrate. As a further enhancement, the portion of the 33 ms integration time during which the 6.7 ms exposure was occurring could be varied from the beginning to middle to end of the period, either by a pattern or stochastically. The frame period may also be varied through a range that would not be observable to the viewer. This feature would prevent the LED illuminators from oncoming vehicles equipped with the identical night vision systems from causing blooming in each others images.

In a further enhancement of this embodiment, the LED illuminators may be pulsed according to a predetermined pattern indicating a code that may be unique for each device. The image may be sampled at a rate such that the code can be recognized by the control system. In this way, reflected light from the LEDs could be distinguished from all other light sourced according to the coded pulses. This concept could further be employed to enhance functionality of other vision systems, such as a exterior light control system as described in the various disclosures incorporated herein by reference. For such a system, IR lights may be pulsed to distinguish reflective objects from self-luminous objects. False deactivation of high beam headlamps for reflective objects may be reduced through this means. Also, visible light sources, such as visible LED headlights may be pulsed according to a pattern or code in the same way to distinguish reflections from self-luminous objects.

In addition to the use of LEDs for NIR light source 110, other narrow band light sources, such as NIR lasers, may provide similar benefits and allow the equivalent function to that described. Another useful NIR light source is a high intensity discharge light source with enhanced NIR radiation. Such sources can provide a significant amount of NIR radiation and can be configured as NIR only emitters by blocking visible light. Discharge light sources can provide a narrow band spike which can be coupled with the appropriate band pass filter to achieve the benefits described above. Additionally, an AC ballast can be constructed to synchronously strike the arc with the highest intensity when the imager is acquiring.

In a further embodiment, a first image is acquired and stored when the NIR source is pulsed on and another image is acquired when the NIR source is off. The off-image is then subtracted from the on-image on a pixel-by-pixel basis. In this way, light rays from other sources are completely subtracted from the reflected light.

While the use of image sensors specifically designed to provide high dynamic range imaging provides many advantages, it is envisioned that the techniques taught in the present invention may provide a significant enough improvement in the ratio between imaged reflected light from NIR light source 110 to other light sources to enable the use of more conventional image sensing technology. High performance 10-bit CIF and VGA format image sensors are available at low cost. By employing the techniques described herein with such imagers, a satisfactorily performing night vision system may be produced very inexpensively.

High dynamic range image sensing systems may also be used for vehicle control function, for example to detect the presence of other traffic and to automatically control a vehicle's exterior lights accordingly. For example, a vehicle's high beams may be switched off if the headlamps or tail lamps of another vehicle are detected. Such a system is described in U.S. patent application Ser. No. 09/800,460 and other disclosures incorporated herein by reference. In order to accurately estimate the distance to other vehicles, and to adequately distinguish vehicular lights from other light sources, such as sign reflections, a measure of the light source's brightness is needed. The ratio in brightness between close oncoming headlamps and distant tail lamps is many thousand to one. Therefore, several different image exposures are needed to cover the brightness range. Prior systems first acquired low sensitivity images and analyzed the images to find bright light sources and then, if no sources were found, proceeded to acquire images with high exposure. The use of a high dynamic range image system allows a single image to be acquired and analyzed.

When used in conjunction with a vehicular vision system, or other application, the added expense of a high dynamic range imaging system may be justifiable for exterior light control. However, when only the exterior light control feature is desired, this cost is currently prohibitive. To solve this problem, the present invention provides for the construction of a synthetic high dynamic range image from several images of varying exposure time. For example, consider the construction of a high dynamic range image from three separate images with exposure times of 1 ms, 6 ms, and 36 ms. First, a 1 ms image is acquired. As this image is received, all pixels are multiplied by 36 (the scale factor) and stored to memory. Next, the 6 ms image is acquired and received pixel by pixel. For each pixel, if the current value in memory from the 1 ms image is zero (representing no signal from the 1 ms image) the 6 ms image pixel is multiplied by 6 and stored to memory. Finally, the sequence is repeated again for the 36 ms image. If, for each pixel, the current value in memory is zero, the value from the 36 ms image is stored to memory.

The memory requirement for storing the synthetic high dynamic range image may be reduced by taking the log of each pixel value after it is multiplied by the scale factor. This process can be performed by using a series of look-up tables for each image. For example, the lowest exposure image may be received and the stored log-scaled value may be retrieved from a look-up table where the index to the table is the greyscale value received from the imager. Further, any non-linearities in the response of the imager may be corrected through this set of look-up tables. When the image is later processed, an inverse look-up table may be provided to convert the stored value to a linear greyscale value.

Prior proposed methods of processing images for exterior light control involved the extraction of objects, such as groups of connected pixels, each of which exceeded a threshold. For these objects, properties such as the centroid and total greyscale value of all pixels were used to identify the objects and control the headlamps accordingly. This technique may not be as appropriate when a synthetic high dynamic range image is used, especially if the resolution of the imaging system is low. Problems result from blooming of light sources and blending of multiple sources into one object with no distinct dark area in between.

The present invention provides an improved image processing method which identifies separate light sources by examining the images and finding distinct peaks in the image. Each peak is considered as a separate light source and properties such as the peak brightness, center, size, and color and movement of the source peak are used to identify the object. The peak detection method proceeds as follows: First, the image is raster scanned to find a pixel with a grey scale value higher than a threshold. Once such a pixel is found the brightness gradient (the rate of increase in greyscale value with position) is computed in each direction. The next pixel visited will be the pixel in the direction of the highest gradient. From this next pixel the gradient in each direction is again determined. This process continues until the peak is found and the gradient is negative in all directions. The peak location and brightness may then be stored for classification later. Next, the object size may be determined by traversing pixels surrounding the peak while the gradient for these pixels decreases in the direction away from the peak. The border of the object is the point where the gradient flattens out or the greyscale value falls below a threshold. Alternatively, the border may be a point at which the greyscale value falls below a percentage of the peak value. The distance in pixels between the peak and the end points determines the size of the objects. This parameter, along with centroid, peak brightness, total greyscale value, color, color at peak, and other properties may be used to identify the object.

In yet another method of identifying light sources by detecting light sources, each pixel is examined in a raster-scan format. First, the pixel is compared to a minimum brightness threshold. If it exceeds the threshold, it is compared to pixels in a local neighborhood (for example the 8 bordering pixels) to determine if it is the brightest pixel in the neighborhood. If so, the gradient of the peak is determined by computing the average difference between the pixel and some of it's neighbors, for example the north, south, east, and west neighbors two pixels away. If this value exceeds a threshold, the pixel is determined to be a peak. Other properties of the peak such as those listed for the prior method may be used to evaluate if the peak corresponds to a object of interest to the control algorithm.

It is envisioned the imager provided for a night vision system may also serve for the exterior light control function. A significant improvement results when a pulsed NIR light source is used. Images may be acquired with light sources both on and off. Those objects that are present in both images are separate light sources while objects significantly brighter in the image with the NIR source activated are more likely stationary reflective objects. By distinguishing these objects from one another, nuisance deactivation of high beam lamps for signs and other objects can be reduced.

A significant problem may arise when using a night vision image sensor assembly for exterior light control when a bandpass filter is used as previously described to transmit only the band of light emitted from NIR light source 110. Several modern vehicle lighting technologies such as high intensity discharge headlamps and LED tail lamps emit little or no infrared radiation. Therefore, such sources would be undetectable by an image sensor assembly with such a bandpass filter. To overcome this limitation, the bandpass filter may be made moveable through a shutter to allow visible imaging when the shutter is removed. Alternatively, visible light may be blocked using a visible light absorbing LCD, electrochromic filter, or suspended particle device for night vision operation and cleared for exterior light control operation. Finally, a separate visible light ray image sensor assembly may be provided to detect vehicular light sources and the infrared image sensor assembly may be used to distinguish reflective objects from luminous objects as described.

The features of the present invention may be used to construct vision systems for functions other than night vision or exterior light control. Examples of such applications include, vehicle rear vision, collision avoidance, obstacle detection, adaptive cruise control, rain sensing and lane departure warning systems. The use of a high dynamic range imaging system is particularly advantageous when multiple features are performed with a single image sensor assembly. For example, the difference in brightness between road markings and oncoming vehicles is very large. To perform both an exterior light control function and a lane departure warning function, a high dynamic range image will be needed. The high dynamic range can be achieved through either a single image or multiple images of multiple exposures or a synthetic high dynamic range image. In either case it is important that bright light sources to not wash out the lane markings needed for proper lane detection. Similar conditions may appear for other applications as well.

The vehicular vision systems described herein may advantageously be incorporated, at least in part, into an outside mirror assembly. The individual systems described herein may share components and, or, may be integrated with one another.

Figure 4:
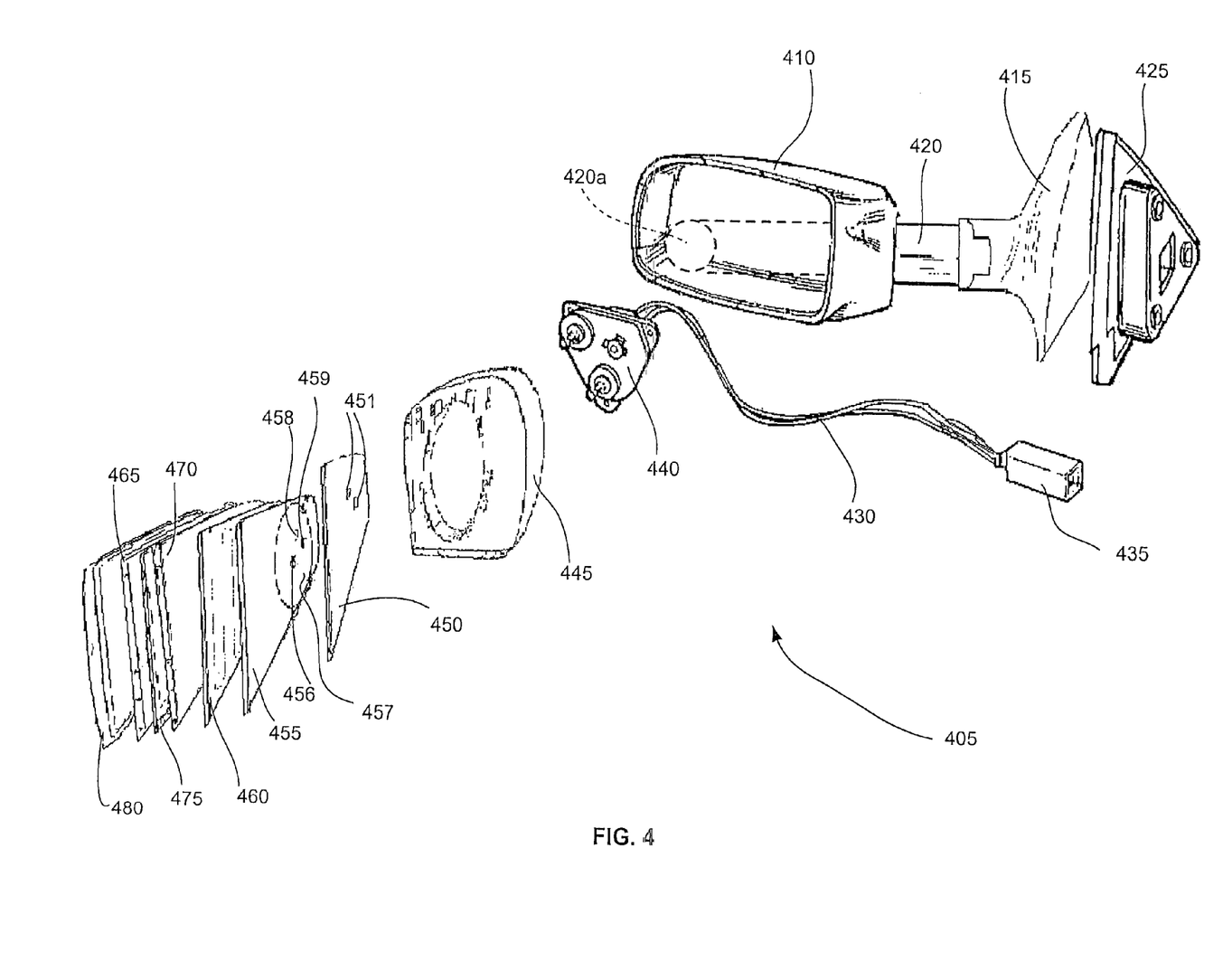
FIG. 4 depicts an exploded view of an exterior rearview mirror assembly.

Turning now to FIG. 4, there is shown an exploded view of an exterior rearview mirror assembly 405 having a housing 410 connected to an attachment member 415 via a telescoping extension 420. In at least one embodiment, the telescoping extension 420 comprises a single arm having a linear actuator for extending and retracting the telescoping extension from within the associated vehicle. The telescoping extension 420 may comprise a rack and pinion type linear actuator, an electrical solenoid type linear actuator, a pneumatic piston or a hydraulic actuator. The housing 410 may be configured such that the housing axially pivots about the telescoping extension. Additionally, the telescoping extension may be configured such that the housing may be folded inward toward the associated vehicle and outward away from the associated vehicle. The attachment member 415 is configured to be received by a vehicle mount 425. The vehicle mount may be fixed to a door panel, an A-pillar, a front fender, a window assembly, or any other position where a driver can view the scene generally rearward of the associated vehicle. It should be understood that the telescoping extension may comprise two or more arms and that the housing may be configured to pivot and fold irrespective of the number of arms employed. It should also be understood that the housing may be connected to a non-telescoping extension at a location shown as reference number 420a such that the housing pivots about the connection 420a such that the mirror may be positioned closer or farther from the vehicle as desired; this feature may be accompanied by a power positioning mechanism such that actuation may be performed inside the vehicle. It should be understood that the mirror housing, extension and attachment member may be configured such that the telescoping, pivoting and folding requires a manual operation.

A wiring harness 430 with a connecter 435 is provided to interface the exterior mirror with associated apparatus located inside the associated vehicle. The wiring harness may be configured to provide extension, folding and pivoting of the housing and may also be configured to provide reflective element control, electrical power, turn signal actuation, mirror heater control, mirror element positioning, light sensor interface, exterior mirror circuit board interface, transceiver interface, information display interface, antenna interface, light source power and control, emergency flasher interface, and all other electrical features as described herein. It should be understood that operator interfaces are provided within the vehicle for each of these features where appropriate.

A mirror element positioner 440 is provided for aligning the associated reflective element within the housing from the interior of the associated vehicle. It should be understood that a corresponding operator interface is provided within the vehicle for positioning of the reflective element.

The positioner 440 is mechanically connected to a carrier for providing a secure structure for supporting and moving of the associated reflective element. Examples of suitable carriers are described in U.S. Pat. Nos. 6,195,194 and 6,239,899, the disclosures of which are incorporated herein in their entireties by reference.

In at least one embodiment, a double sided adhesive foam 450 is employed to attach the reflective element to the carrier. In certain instances, apertures 451 may be provided in the double sided adhesive foam for accommodating positioning of various components.

In at least one embodiment, an electrical circuit board 455 is provided in the rearview mirror assembly. The electrical circuit board may comprise a light source such as a turn signal light, a keyhole illuminator, or an outside door area illuminator, as taught in U.S. Pat. No. 6,441,943, the entire disclosure of which is incorporated in its entirety herein by reference, an information display, an antenna, a transceiver, a reflective element control, an outside mirror communication system, a remote keyless entry system, proximity sensors, and interfaces for other apparatus described herein. U.S. Pat. Nos.

6,244,716, 6,523,976, 6,521,916, 6,441,943, 6,335,548, 6,132,072, 5,803,579, 6,229,435, 6,504,142, 6,402,328, 6,379,013, and 6,359,274 disclose various electrical components and electrical circuit boards that may be employed in one or more embodiments, the disclosures of each of each of these U.S. patents are incorporated herein in their entireties by reference.

In at least one embodiment, a rearview mirror assembly is provided with a heater 460 for improving the operation of the device and for melting frozen precipitation that may be present. Examples of various heaters are disclosed in U.S. Pat. Nos. 5,151,824, 6,244,716, 6,426,485, 6,441,943 and 6,356,376, the disclosures of each of these patents are incorporated in their entireties herein by reference.

In at least one embodiment, the reflective element is has variable reflectance feature. The variable reflectance reflective element may comprise a first substrate 465 and a second substrate 470 secured in a spaced apart relationship by a seal 475 to define a chamber therebetween. The reflective element may be configured to define a convex element, an aspheric element, a planar element, a non-planar element, a wide field of view element, or a combination of these various configurations in different areas to define a complex mirror element shape. The first surface of the first substrate may comprise a hydrophilic or hydrophobic coating to improve the operation. The reflective element may comprise transflective properties such that a light source, or information display, may be positioned behind the element and project light rays therethrough. The reflective element may comprise an anti-scratch layer, or layers, on the exposed surfaces of the first and, or, second substrates. The reflective element may comprise area(s) that are devoid of reflective material, such as etched in bars or words, to define information display area(s). Examples of various reflective elements are described in U.S. Pat. Nos. 5,682,267, 5,689,370, 6,064,509, 6,062,920, 6,268,950, 6,195,194, 5,940,201, 6,246,507, 6,057,956, 6,512,624, 6,356,376, 6,166,848, 6,111,684, 6,193,378, 6,239,898, 6,441,943, 6,037,471, 6,020,987, 5,825,527 6,111,684 and 5,998,617, the disclosures of each of these patents are incorporated in their entireties herein by reference.

Preferably the chamber contains an electrochromic medium. Electrochromic medium is preferably capable of selectively attenuating light traveling therethrough and preferably has at least one solution-phase electrochromic material and preferably at least one additional electroactive material that may be solution-phase, surface-confined, or one that plates out onto a surface. However, the presently preferred media are solution-phase redox electrochromics, such as those disclosed in commonly assigned U.S. Pat. Nos. 4,902, 108, 5,128,799, 5,278,693, 5,280,380, 5,282,077, 5,294,376, 5,336,448, 5,808,778 and 6,020,987; the entire disclosures of which are incorporated herein in their entireties by reference. If a solution-phase electrochromic medium is utilized, it may be inserted into the chamber through a sealable fill port through well-known techniques, such as vacuum backfilling and the like.

It may be desirable to incorporate a gel into the electrochromic device as disclosed in commonly assigned U.S. Pat. No. 5,940,201 entitled "AN ELECTROCHROMIC MIRROR WITH TWO THIN GLASS ELEMENTS AND A GELLED ELECTROCHROMIC MEDIUM," filed on Apr. 2, 1997. The entire disclosure of this U.S. patent is incorporated herein by reference.

In at least one embodiment, a rearview mirror assembly is provided with an electro-optic element having a substantially transparent seal. Examples of substantially transparent seals and methods of forming substantially transparent seals are provided in U.S. Pat. No. 5,790,298, the entire disclosure of which is included herein by reference.

In at least one embodiment, the rearview mirror assembly is provided with a bezel 480 for protecting the associated seal from damaging light rays and to provide an aesthetically pleasing appearance. Examples of various bezels are disclosed in U.S. Pat. Nos. 5,448,397, 6,102,546, 6,195,194, 5,923,457, 6,238,898, 6,170,956 and 6,471,362, the disclosures of which are incorporated herein in their entireties by reference.

The vehicular visions systems described herein may advantageously be incorporated, at least in part, into an interior rearview mirror assembly. The individual systems described herein may share components and, or, may be integrated with one another.

The present invention has been described as incorporating an electrochromic mirror element within the mirror housing of the inventive rearview mirror assembly. It will be appreciated by those skilled in the art that various other vehicle accessories and components may be incorporated in the rearview mirror assembly in whole or in part and in various combinations. Such vehicle accessories and components may be mounted within, on or to the mirror housing, the mirror mount, an attachment to the mirror mount or housing, or in a console or other housing associated with the rearview mirror assembly. Additionally, any such vehicle accessories may share components with one another, such as processors, sensors, power supplies, wire harnesses and plugs, displays, switches, antennae, etc. Examples of other vehicle accessories, components or features are described further below.

Figure 5:
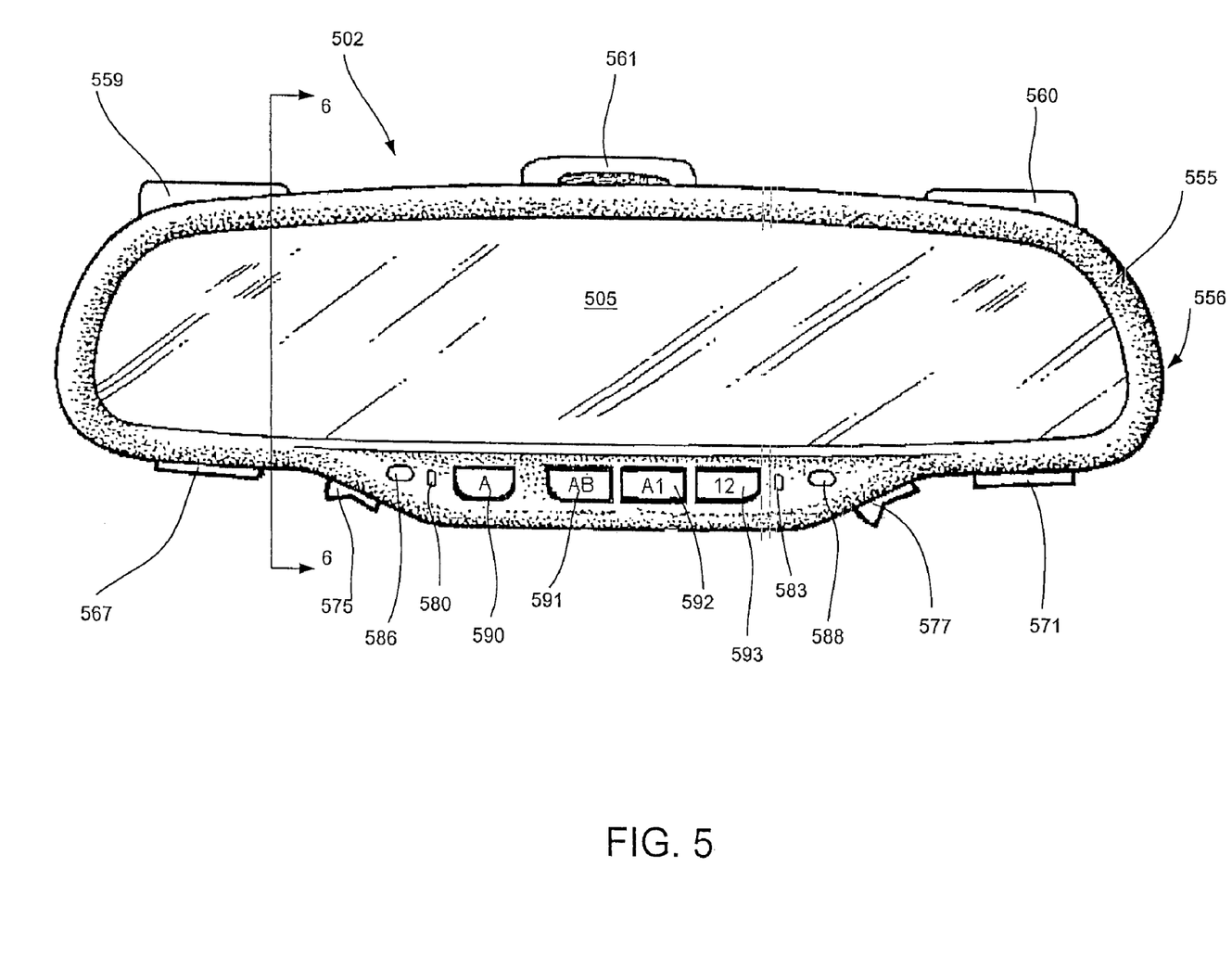
FIG. 5 depicts an interior rearview mirror assembly.

Turning now to FIG. 5, a mirror assembly 502 is shown to comprise a bezel 555 and a case 556. The bezel and the case combine to define the mirror housing for incorporation of features in addition to a reflective element and information displays. Commonly assigned U.S. Pat. Nos. 6,102,546, D410,607, 6,407,468, 6,420,800, and 6,471,362, the disclosures of which are incorporated in their entireties herein by reference, describe examples of various bezels, cases and associated button construction that may be used with the present invention.

Figure 6:
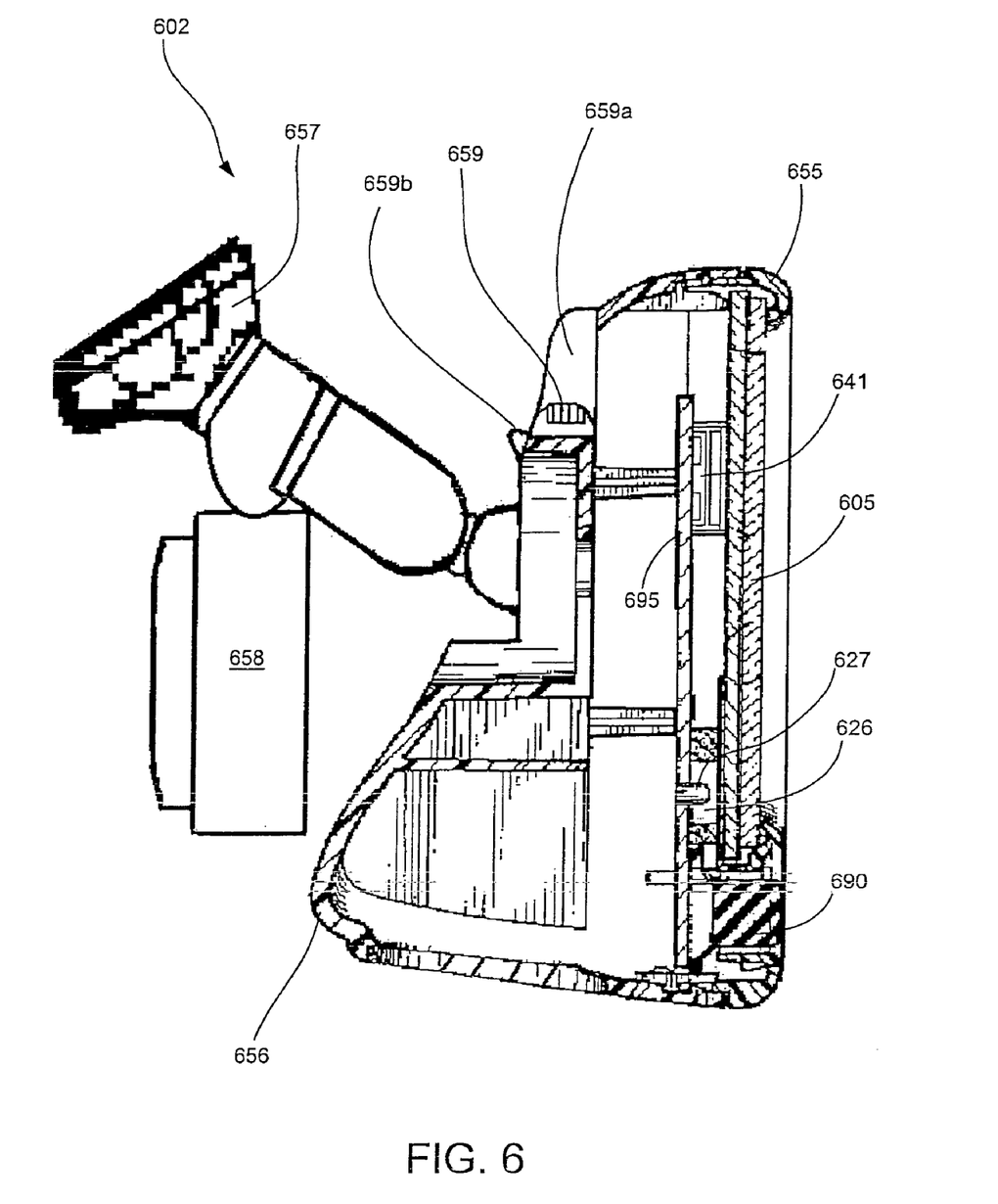
FIG. 6 depicts a sectional view of the mirror assembly of FIG. 5 taken along section line 6-6.
Figure 7:
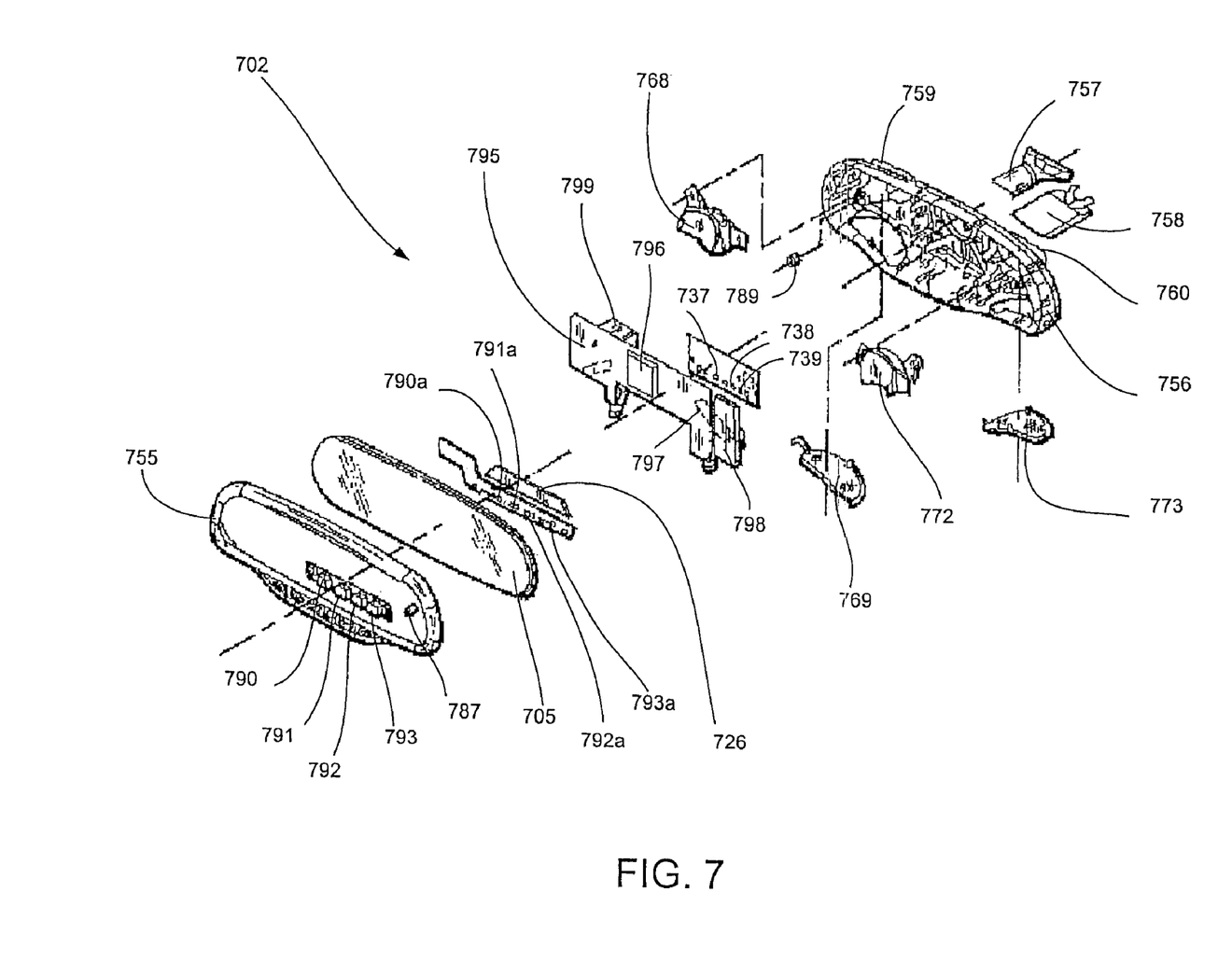
FIG. 7 depicts an exploded view of an interior rearview mirror assembly.

As depicted in FIG. 5, the mirror assembly may comprise first and second microphones 559, 560. Examples of microphones for use with the present invention are described in commonly assigned U.S. patent application Ser. Nos. 09/444, 176 and 09/724,119, U.S. Patent Application Publication No. US 2002/0110256 A1, and PCT Application No. PCT/US02/ 32386, the disclosures of which are incorporated in their entireties herein by reference. As depicted in FIGS. 5, 6 and 7, the microphone or microphones may be mounted on the top of the mirror assembly, on the bottom of the mirror assembly, on the backside of the mirror case, or any where within the mirror case or bezel. Preferably, two microphones are incorporated, one near each end, into the mirror assembly on the backside of the mirror case within recessed portion 659a and having an acoustic dam 659b as shown in FIGS. 5, 6 and 7. These systems may be integrated, at least in part, in a common control with information displays and/or may share components with the information displays. In addition, the status of these systems and/or the devices controlled thereby may be displayed on the associated information displays.

With further reference to FIG. 5, mirror assembly 502 may include first and second illumination assemblies 567, 571. Various illumination assemblies and illuminators for use with the present invention are described in commonly assigned U.S. Pat. Nos. 5,803,579, 6,335,548, 6,441,943, 6,521,916, and 6,523,976, as well as, commonly assigned U.S. patent application Ser. Nos. 09/723,675, 10/078,906, and 10/230, 804, the disclosures of which are incorporated in their entireties herein by reference. As further depicted in FIG. 7, each illumination assembly preferably comprises a reflector, a lens and an illuminator (not shown). There may be two illumination assemblies generally positioned to illuminate a front passenger seat area and the second generally positioned to illuminate a driver seat area. Alternatively, there may be only one illumination assembly that illuminates both seat areas and/or there may be additional illuminator assemblies such as one to illuminate a center console area, overhead console area or an area between the front seats.

With further reference to FIG. 5, mirror assembly 502 includes first and second switches 575, 577. Suitable switches for use with the present invention are described in detail in commonly assigned U.S. Pat. Nos. 6,407,468, 6,420,800, 6,426,568, and 6,471,362, as well as, commonly assigned U.S. Patent Application Publication No. US 2002/0024713 A1, the disclosures of which are incorporated in their entireties herein by reference. These switches may be incorporated to control the illumination assemblies, the displays, the mirror reflectivity, a voice activated system, a compass system, a telephone system, a highway toll booth interface, a telemetry system, a headlight controller, a rain sensor, a tire pressure monitoring system, a navigation system, a lane departure warning system, an adaptive cruise control system, etc. Any other display or system described herein or within the references incorporated by reference may be incorporated in any location within the associated vehicle and may be controlled using the switches.

With further reference to FIG. 5, mirror assembly 502 includes first and second indicators 580, 583. Various indicators for use with the present invention are described in commonly assigned U.S. Pat. Nos. 5,803,579, 6,335,548, 6,441,943, 6,521,916, and 6,523,976, as well as, commonly assigned U.S. patent application Ser. Nos. 09/723,675, 10/078,906, and 10/230,804, the disclosures of which are incorporated in their entireties herein by reference. These indicators may indicate the status of the displays, the mirror reflectivity, a voice activated system, a compass system, a telephone system, a highway toll booth interface, a telemetry system, a headlight controller, a rain sensor, a security system, etc. Any other display or system described herein or within the references incorporated by reference may be incorporated in any location within the associated vehicle and may have a status depicted by the indicators.

With further reference to FIG. 5, mirror assembly 502 may include first and second light sensors 586, 588 (glare and ambient sensors 787, 789 in FIG. 7). Preferred light sensors for use within the present invention are described in detail in commonly assigned U.S. Pat. Nos. 5,923,027, 6,313,457, 6,359,274, 6,379,013, and 6,402,328, U.S. Patent Application Publication No. US 2002/0056806 A1, and in U.S. patent application Ser. No. 10/068,540, the disclosures of which are incorporated in their entireties herein by reference. The glare sensor and/or ambient sensor automatically control the reflectivity of a self dimming reflective element as well as the intensity of information displays and/or backlighting. The glare sensor is used to sense headlights of trailing vehicles and the ambient sensor is used to detect the ambient lighting conditions that the system is operating within. In another embodiment, a sky sensor may be incorporated positioned to detect light levels generally above and in front of an associated vehicle, the sky sensor may be used to automatically control the reflectivity of a self-dimming element, the exterior lights of a controlled vehicle and/or the intensity of information displays. The mirror assembly may further include sunload sensors for sensing light levels towards the driver side and passenger side of the vehicle so as to control the climate control system of the vehicle.

With further reference to FIG. 5, mirror assembly 502 may include first, second, third and fourth operator interfaces 590, 591, 592, 593 located in mirror bezel 555. Each operator interface is shown to comprise a backlit information display "A," "AB," "A1" and "12". It should be understood that these operator interfaces can be incorporated any where in the associated vehicle, for example, in the mirror case, accessory module, instrument panel, overhead console, dash board, seats, center console, etc. Suitable switch construction is described in detail in commonly assigned U.S. Pat. Nos. 6,407,468, 6,420,800, 6,426,568, and 6,471,362, as well as, commonly assigned U.S. Patent Application Publication No. US 2002/0024713 A1, the disclosures of which are incorporated in their entireties herein by reference. These operator interfaces may control the illumination assemblies, the displays, the mirror reflectivity, a voice activated system, a compass system, a telephone system, a highway toll booth interface, a telemetry system, a headlight controller, a rain sensor, a tire pressure monitoring system, a navigation system, a lane departure warning system, an adaptive cruise control system, etc. Any other display or system described herein or within the references incorporated by reference may be incorporated in any location within the associated vehicle and may be controlled using an operator interface or interfaces. For example, a user may program a display or displays to depict predetermined information or may program a display or displays to scroll through a series of information, or may enter set points associated with certain operating equipment with associated sensor inputs to display certain information upon the occurrence of a given event. In one embodiment, for example, a given display may be in a non-illuminated state until the engine temperature is above a threshold, the display then automatically is set to display the engine temperature. Another example is that proximity sensors located on the rear of a vehicle may be connected to a controller and combined with a display in a rearview mirror to indicate to a driver the distance to an object; the display may be configured as a bar that has a length proportional to the given distance.

Although specific locations and numbers of these additional features are depicted in FIG. 5, it should be understood that fewer or more individual devices may be incorporated in any location within the associated vehicle and as described within the references incorporated herein.

Turning now to FIG. 6 there is shown a section view of a mirror assembly 602. The depicted section of FIG. 6 is taken along cut line 6-6 of FIG. 5. FIG. 6 shows a preferred positional relationship of third and fourth information displays 626, 641 with respect to reflective element 605 along with third information display backlighting 627 within a housing defined by case 656 and bezel 655. Mirror assembly 602 is also shown to comprise a microphone 659; first operator interface 690; along with circuit board 695; mirror mount 657 and accessory module 658. The mirror mount 657 and/or an accessory module 658 may comprise compass sensors, a image sensor assembly, a headlight control, an additional microprocessor, a rain sensor, additional information displays, additional operator interfaces, etc.

Turning now to FIG. 7, there is shown an exploded view of a mirror assembly 702. FIG. 7 provides additional detail with regard to one preferred positional relationship of individual components, as well as, providing additional structural detail of a mirror assembly. Mirror assembly 702 comprises a reflective element 705 within a bezel 755 and a mirror case 756. A mirror mount 757 is included for mounting the mirror assembly within a vehicle. It should be understood that a host of accessories may be incorporated into the mount 757 such as a rain sensor, a image sensor assembly, a headlight control, an additional microprocessor, additional information displays, compass sensors, etc. These systems may be integrated, at least in part, in a common control with information displays and/or may share components with the information displays. In addition, the status of these systems and/or the devices controlled thereby may be displayed on the associated information displays.

Mirror assembly 702 is shown in FIG. 7 to further comprise third information display 726 with third information display backlighting 737, 738, 739; first and second microphones 759, 760; a first reflector 768 with a first lens 769; a second reflector 772 with a second lens 773; a glare sensor 787; an ambient light sensor 789; first, second, third and fourth operator interfaces 790, 791, 792, 793 with first, second, third and fourth operator interface backlighting 790a, 791a, 792a, 793a; a circuit board 795 having a compass sensor module 799; and a daughter board 798 with an input/output bus interface 797.

The first reflector 768 combines with the first lens 769 and a first light source (not shown) to form a first illumination assembly. The second reflector 772 combines with the second lens 773 and a second light source (not shown) to form a second illumination assembly. Preferably, the illumination assemblies with associated light source are constructed in accordance with the teachings of commonly assigned U.S. Pat. Nos. 5,803,579, 6,335,548, 6,441,943, 6,521,916, and 6,523,976, as well as, commonly assigned U.S. patent application Ser. Nos. 09/723,675, 10/078,906, and 10/230,804, the disclosures of which are incorporated in their entireties herein by reference.

Preferably, the glare light sensor 787 and the ambient light sensor 789 are active light sensors as described in commonly assigned U.S. Pat. Nos. 6,359,274 and 6,402,328, the disclosures of which are incorporated in their entireties herein by reference. The electrical output signal from either, or both, of the sensors 787, 789 may be used as inputs to a controller 796 to control the reflectivity of reflective element 705 and, or, the intensity of third information display backlighting 727. The details of various control circuits for use herewith are described in commonly assigned U.S. Pat. Nos. 5,883,605, 5,956,012, 6,084,700, 6,222,177, 6,224,716, 6,247,819, 6,249,369, 6,392,783 and 6,402,328, the disclosures of which are incorporated in their entireties herein by reference. These systems may be integrated, at least in part, in a common control with information displays and/or may share components with the information displays. In addition, the status of these systems and/or the devices controlled thereby may be displayed on the associated information displays.

Although the compass sensor module 799 is shown to be mounted to circuit board 795 in FIG. 7, it should be understood that the sensor module may be located within mount 757, an accessory module 758 positioned proximate mirror assembly 702 or at any location within an associated vehicle such as under a dash board, in an overhead console, a center console, a trunk, an engine compartment, etc. Commonly assigned U.S. Pat. Nos. 6,023,229 and 6,140,933, as well as, commonly assigned U.S. patent application Ser. Nos. 09/989, 559, 10/210,910 60/360,723, and 60/449,828, the disclosures of which are incorporated in their entireties herein by reference, describe in detail various compass systems for use with the present invention. These systems may be integrated, at least in part, in a common control with information displays and/or may share components with the information displays. In addition, the status of these systems and/or the devices controlled thereby may be displayed on the associated information displays.

Daughter board 798 is in operational communication with circuit board 795. Circuit board 795 may comprise a controller 796, such as a microprocessor, and daughter board 798 may comprise an information display (not shown in FIG. 7). The microprocessor may, for example, receive signal(s) from the compass sensor module 799 and process the signal(s) and transmit signal(s) to the daughter board to control a display to indicate the corresponding vehicle heading. As described herein and within the references incorporated by reference herein, the controller may receive signal(s) from light sensor(s), rain sensor(s) (not shown), automatic vehicle exterior light controller(s) (not shown), microphone(s), global positioning systems (not shown), telecommunication systems (not shown), operator interface(s) and a host of other devices, and control the information display(s) to provide appropriate visual indications.

Controller 796 (or controllers) may, at least in part, control the mirror reflectivity, exterior lights, rain sensor, compass, information displays, windshield wipers, heater, defroster, defogger, air conditioning, telemetry systems, voice recognition systems such as digital signal processor based voice actuation systems, and vehicle speed. The controller 796 (or controllers) may receive signals from switches and or sensors associated with any of the devices described herein and in the references incorporated by reference herein to automatically manipulate any other device described herein or described in the references included by reference. The controller 796 may be, at least in part, located outside the mirror assembly or may comprise a second controller elsewhere in the vehicle or additional controllers throughout the vehicle. The individual processors may be configured to communicate serially, in parallel, via Bluetooth protocol, wireless communication, over the vehicle bus, over a CAN bus or any other suitable communication.

Exterior light control systems as described in commonly assigned U.S. Pat. Nos. 5,990,469, 6,008,486, 6,130,421, 6,130,448, 6,255,639, 6,049,171, 5,837,994, 6,403,942, 6,281,632, 6,291,812, 6,469,739, 6,465,963, 6,429,594, and 6,379,013, U.S. Patent Application Publication No. US 2002/0005472 A1 and U.S. patent application Ser. Nos. 09/528, 389, 09/678,586, 09/800,460, 60/404,879, 60/394,583, 10/235,476, and 10/208,142, the disclosures of which are incorporated in their entireties herein by reference, may be incorporated in accordance with the present invention. These systems may be integrated, at least in part, in a common control with information displays and/or may share components with the information displays. In addition, the status of these systems and/or the devices controlled thereby may be displayed on the associated information displays.

Moisture sensors and windshield fog detector systems are described in commonly assigned U.S. Pat. Nos. 5,923,027 and 6,313,457 and U.S. patent application Ser. Nos. 09/970, 728 and 09/970,962, the disclosures of which are incorporated in their entireties herein by reference. These systems may be integrated, at least in part, in a common control with information displays and/or may share components with the information displays. In addition, the status of these systems and/or the devices controlled thereby may be displayed on the associated information displays.

Commonly assigned U.S. Pat. No. 6,262,831, the disclosure of which is incorporated herein by reference in its entirety, describes power supplies for use with the present invention. These systems may be integrated, at least in part, in a common control with information displays and/or may share components with the information displays. In addition, the status of these systems and/or the devices controlled thereby may be displayed on the associated information displays.

The mirror assembly may further include one or more antennae for receipt and/or transmission of RF signals. Appropriate receiving, transmitting, and/or processing circuitry may further be included in or attached to the mirror assembly. Such antennae may be used for a cellular telephone system, a BLUETOOTH™ transmitting/receiving system, a remote keyless entry (RKE) system, a trainable garage door opener system, a tire pressure monitoring system, a global positioning satellite system, a LORAN system, etc. Some of these systems may share a common antenna and receiving, transmitting, processing, and display circuits where appropriate. Examples of a tire pressure monitoring system incorporated in a rearview mirror assembly are disclosed in commonly assigned U.S. Pat. Nos. 6,215,389 and 6,431,712 and in U.S. patent application Ser. Nos. 09/359,144 and 09/949,955, the entire disclosures of which are incorporated herein by reference. Examples of a GPS system incorporated in a rearview mirror assembly are disclosed in commonly assigned U.S. Pat. Nos. 6,166,698, 6,297,781, 6,396,446, and in U.S. Patent Published Application No. US 2002/0032510 A1, the entire disclosures of which are incorporated herein by reference. An example of a LORAN system incorporated in a rearview mirror assembly is disclosed in commonly assigned U.S. Patent Application Publication No. US 2002/0193946 A1, the entire disclosure of which is incorporated herein by reference. An example of both telephone/telematics system and a BLUETOOTH™ system incorporated in a rearview mirror assembly is disclosed in commonly assigned U.S. Patent Application No. US 2002/0032510 A1, the entire disclosure of which is incorporated herein by reference. Examples of a trainable garage door opening systems and RKE systems incorporated in a rearview mirror assembly are disclosed in U.S. Pat. No. 6,091,343, the entire disclosures of which are incorporated herein by reference. The mirror may further include an infrared (IR) transmitter/receiver for transmitting/receiving information to and from the mirror assembly and possibly to and from the vehicle. An example of such a rearview mirror assembly is disclosed in commonly-assigned U.S. Pat. No. 6,407,712, the entire disclosure of which is incorporated herein by reference.

The mirror assembly may further include one or more of the same or different types of displays. Examples of different types of displays include vacuum fluorescent, LCD, reverse LCD, LED, organic LED, dot matrix, backlit indicia, etc. For displays intended to simultaneously display significant amounts of information, the display disclosed in commonly-assigned U.S. Pat. No. 6,346,698 may be used. The entire disclosure of which is incorporated herein by reference. Examples of backlit indicia panel displays are disclosed in commonly-assigned U.S. Pat. Nos. 6,170,956 and 6,356,376 and in U.S. patent application Ser. Nos. 09/586,813 and 09/664,151, the entire disclosures of which are incorporated herein by reference. Various displays used in rearview mirrors are disclosed in commonly-assigned U.S. Pat. No. 6,356,376 and in U.S. Patent Application Publication No. US 2002/0154379 A1, the entire disclosures of which are incorporated herein by reference.

The wiring for the vehicle accessories in the rearview mirror assembly housing may be run through the mounting bracket and along the windshield (if the mounting bracket does not already extend to the headliner) under a channel mount. An example of a rearview mirror assembly in which the wiring for accessories in the mirror assembly housing are routed through the mounting bracket is disclosed in commonly-assigned U.S. Pat. No. 6,467,919, the entire disclosure of which is incorporated herein by reference.

While the invention has been described with reference to details of the embodiments shown in the drawings, these details are not intended to limit the scope of the invention as described in the appending claims. It should be understood that all equivalents in structure and function with those described herein are within the scope of the present invention. Additionally, it should be understood that individual structure and function described herein may be combined individually within one or more embodiments not explicitly described.

The invention claimed is:

1. A vehicular vision system, comprising:
an image sensor and a light source, said light source is configured to emit light rays in the non-visible spectrum to illuminate objects within a scene external to a controlled vehicle beyond an exterior surface of a windshield, wherein said light source is configured to operate in synchronous relationship with acquisition of images from said image sensor, the vision system comprising a means for distinguishing reflections from self-luminous objects.

2. A vehicular vision system as in claim 1 configured for use in an apparatus selected from the group comprising: rear vision, collision avoidance, obstacle detection, adaptive cruise control, rain sensing, exterior light control, and lane departure warning.

3. A vehicular vision system as in claim 1 wherein said light source is a broadband emitter having a visible light ray blocking filter.

4. A vehicular vision system as in claim 1 wherein said light source is a narrow band emitter.

5. A vehicular vision system as in claim 4 wherein said light source comprising at least one light emitting diode.

6. A vehicular vision system as in claim 5 wherein said light source emits light rays in the range from approximately 780 nm to approximately 1100 nm.

7. A vehicular vision system as in claim 5 wherein said light source is pulsed with momentary energy levels that exceed a one hundred percent duty cycle level.

8. A vehicular vision system as in claim 1 wherein said image sensor further comprising a narrow band pass spectral filter.

9. A vehicular vision system as in claim 8 wherein said spectral filter is placed between said scene and said image sensor.

10. A vehicular vision system as in claim 8 wherein said band pass spectral filter is selected from the group comprising: a movable shutter, a visible light absorbing LCD, an electrochromic filter and a suspended particle device.

11. A vehicular vision system as in claim 1 wherein said light source is a near infrared laser.

12. A vehicular vision system as in claim 1 further comprising an AC ballast.

13. A vehicular vision system as in claim 12 wherein said AC ballast is configured to synchronously strike an arc with high intensity when an image is acquired from said image sensor.

14. A vehicular vision system as in claim 1 configured for use in an apparatus selected from the group comprising: rear vision, collision avoidance, obstacle detection, adaptive cruise control, rain sensing, exterior light control, and lane departure warning.

15. A vehicular vision system as in claim 1 further comprising a spectral filter located between said image sensor and the scene, wherein said spectral filter is configured to substantially block light rays other than the predominant spectral band of light rays emitted by said light source.

* * * * *